United States Patent [19]

Tanaka et al.

[11] Patent Number: 5,532,971
[45] Date of Patent: Jul. 2, 1996

[54] NONVOLATILE SEMICONDUCTOR MEMORY HAVING ENHANCED SPEED FOR ERASING AND PROGRAMMING

[75] Inventors: Toshihiro Tanaka, Akigawa; Masataka Kato, Musashino; Keiichi Yoshida, Ome; Hitoshi Kume, Musashino; Yoshinobu Nakagome, Hamura; Katsutaka Kimura, Akishima, all of Japan

[73] Assignee: Hitachi, Ltd., Tokyo, Japan

[21] Appl. No.: 354,639

[22] Filed: Dec. 13, 1994

[30] Foreign Application Priority Data

Dec. 15, 1993 [JP] Japan .................... 5-314712

[51] Int. Cl.[6] .............................. G11C 8/00; G11C 11/34
[52] U.S. Cl. ................... 365/230.06; 365/185.23; 365/230.03; 326/105
[58] Field of Search .................... 365/230.06, 230.03, 365/185, 185.23; 326/105

[56] References Cited

U.S. PATENT DOCUMENTS

| | | | |
|---|---|---|---|
| 5,305,279 | 8/1994 | Park et al. .................... | 365/230.03 |
| 5,402,386 | 3/1995 | Tavrow et al. .................... | 365/230.06 |
| 5,412,331 | 5/1995 | Jun et al. .................... | 365/230.06 X |
| 5,446,700 | 8/1995 | Iwase .................... | 365/230.06 |

*Primary Examiner*—David C. Nelms
*Assistant Examiner*—Son Dinh
*Attorney, Agent, or Firm*—Antonelli, Terry, Stout & Kraus

[57] ABSTRACT

An arrangement is provided to enhance the speed in the operation of erasing and programming of a nonvolatile semiconductor memory that is driven by a single supply voltage and to reduce the number of transistors making up the subword decoder circuit thereby minimizing the size of the device. For this purpose, in the subword decoder circuits WDi1–WDij that drive the word lines Wi1–Wij, the block selection address lines Bip and Bin generated from the first address line group are used as supply voltages for the inverter circuit that controls the voltage of the word line, and the gate selection address line Gj generated from the second address line group is used a gate input line.

3 Claims, 16 Drawing Sheets

NONVOLATILE SEMICONDUCTOR MEMORY HAVING ENHANCED SPEED FOR ERASING AND PROGRAMMING

BACKGROUND OF THE INVENTION

The present invention relates to a nonvolatile semiconductor memory with an electrically erasing and programming (or reprogramming) function, and more specifically to a nonvolatile semiconductor memory that has realized enhanced speed of reprogramming nonvolatile semiconductor memory cells driven by a single external supply voltage and of verifying the state of the reprogrammed memory cells and which has also realized a substantial reduction in the size of the memory.

In a nonvolatile semiconductor memory, in which a group of memory cells (hereinafter referred to as a sector) arranged in array and connected to a common control gate line, i.e., a common word line, are electrically erased and programmed (or reprogrammed), a method has been proposed to erase the memory cells a word line at a time by applying a negative voltage to the word lines. This method is described, for example, in Symposium on VLSI Technology Digest of Technical Papers, pp77–78 1991 and Symposium on VLSI Circuits Digest of Technical Papers, pp85–86 1991. Further, a method of programming that applies a negative potential to a word line is introduced in Technical Digest of International Electron Device Meeting, pp.599–602 1992 and 991–993 1992.

In this programming and erasing method, a technique has been proposed in which a word decoder circuit that drives word lines is constructed in a hierarchical configuration, consisting of a main decoder circuit and a subword decoder circuit. This technique is described in International Solid-State Circuits Conference Digest of Technical Papers, pp154–155 1992; Symposium on VLSI Circuits Digest of Technical Papers pp97–98 1993; and Symposium on VLSI Circuits Digest of Technical Papers pp99–100 1993.

FIGS. 17, 18 and 19 show subword decoder circuits used in the above-mentioned conventional memory devices. The subword decoder circuits shown in FIGS. 17 and 18 consist of one p-channel transistor and two n-channel transistors; and the circuits shown in FIG. 19 consist of two p-channel transistors and two n-channel transistors. In these circuits, denoted W11–W1j are word lines.

The conventional subword decoder circuits (WD11, WD1j) shown in FIG. 17 take in as inputs a block selection address line Bip Generated from a first address line Group and its complementary address line BBip and in-block selection lines Gaj, GBj, GCj Generated from a second address line Group. In the figure, designated VPM is a substrate voltage of the p-channel transistor, and VER is a substrate voltage and a source potential of an n-channel transistor. The conventional subword decoder circuits of FIG. 18 take in as inputs a block selection address line Bip and its complementary address line BBip and an in-block selection line Gj. The conventional circuits of FIG. 19 take in as inputs a block selection address line Bip and its complementary address line BBip and an in-block selection line Gj. Denoted VNN is a substrate voltage of the n-channel transistor.

In the conventional subword decoder circuits shown in FIG. 17, 18 and 19, the erasing and programming operation that lowers the threshold value of the memory cell is performed by applying a negative voltage supplied from the source side of the n-channel transistor to a word line. For example, in the circuit of FIG. 17, setting GC1 to a negative voltage (Bip=0 V, BBip=5 V, GC1=−13 V, GC2–GCj=0 V, GA1–GAj=0 V, GB1–GBj=−13 V, VPM=5 V, VER=−13 V) applies a negative voltage to the word line W11.

With the word line applied a negative voltage, electrons in a floating gate of a memory cell connected to the word line are discharged, lowering the threshold value of the memory cell. In these nonvolatile semiconductor memory devices, after the reprogram operation that lowers the threshold value of the memory cell, an operation to check the threshold value of the memory cell or a verify operation is performed. This verify operation is described, for example, in International Solid-State Circuits Conference Digest of Technical Papers pp60–61 1990. This operation checks the threshold value of a memory cell by applying a positive voltage (verify voltage) lower than the supply voltage to a word line to decide whether or not a current flows into the memory cell.

In the conventional circuits shown in FIGS. 17, 18 and 19, the verify voltage applied to a word line is supplied from the source side of the p-channel transistor. In the circuit of FIG. 17, for instance, setting the line Bip to a positive voltage lower than the supply voltage causes a verify voltage to be applied to a word line (Bip=3.6 V, BBip=0 V, GA1=0 V, GA2–GAj=3.6 V, GB1=0 V, GB2–GBj=3.6 V, GC1–GCj=0 V, VPM=3.6 V, VER=0 V).

Another example of the conventional subword decoder circuit that drives the word line is found in Japanese Patent Laid-Open No. 174595/1993. FIG. 20 shows a conventional subword decoder circuit formed of an inverter circuit.

The conventional subword decoder circuits shown in FIG. 20 (WD11, WD1j) consist of one p-channel transistor and one n-channel transistor, with a common drain of each transistor connected to a word line (W11-W1j). A block selection address line generated from the first address line group is applied to the source of the p-channel transistor and an in-block selection line Gj generated from the second address line group is applied to a common gate of these transistors. The source potential of the n-channel transistor is always at the ground potential Vss.

In this circuit, a potential that can be applied to the word line includes a positive voltage of the block selection address line Bip (for example, a supply voltage Vcc or a high voltage Vpp) and the ground voltage Vss.

SUMMARY OF THE INVENTION

Because the conventional subword decoder circuit shown in FIGS. 17, 18 and 19 consists of three or four transistors to perform the reprogram operation that lowers the threshold value of a memory cell and the subsequent verify operation, its layout is necessarily large making the subword decoder circuit unsuitable for application to the nonvolatile semiconductor memory that is required of a high level of circuit integration.

The conventional subword decoder circuit of FIG. 20, on the other hand, consists of a least number of transistors or two transistors. However, this circuit, too, has a drawback that because the voltage that can be applied to the word line is a positive voltage of the block selection address line Bip (a supply voltage Vcc or a high voltage Vpp, for instance) and a ground voltage Vss, it is not possible to apply to the word line a negative voltage that is required to operate the reprogram operation that lowers the threshold value of a memory cell.

An object of this invention is to provide a nonvolatile semiconductor memory which overcomes the above-mentioned drawbacks and particularly to provide a nonvolatile semiconductor memory which has realized an improved speed of a reprogram operation and a subsequent verify operation (reading the state of a memory cell) performed on the nonvolatile semiconductor memory driven by a single external supply voltage and which has also realized a substantial reduction in the size of the memory.

To achieve the above objective, this invention provides a nonvolatile semiconductor memory with the following configuration. That is, a nonvolatile semiconductor memory which includes:

a memory cell array consisting of a plurality of nonvolatile semiconductor memory cells arranged in array, each cell having a control gate, a drain and a source;

word lines each connected commonly with a plurality of control gates of memory cells; and data lines each connected commonly with a plurality of drains of memory cells;

in which a group of memory cells (sector) connected to their common gate or a word line are electrically reprogrammed (erased and programmed); and in which during the reprogramming operation to lower the threshold voltage of a memory cell, the state of the memory cell is read out (verified) at least once, it is decided based on that information whether the reprogramming operation should be continued or stopped, and the potential of the word line is applied a negative voltage during the reprogramming operation and a positive voltage smaller than the supply voltage during the verify operation.

In such a nonvolatile semiconductor memory, the subword decoder circuit that drives the word line is formed of inverter circuits, whose sources are applied a block selection address line generated from a first address line group and whose gates are applied a gate selection address line generated from a second address line group. The word line connected to the common drain is supplied a potential required for each operation (for example, read, erase, program and verify) from the block selection address line voltage.

By making the subword decoder circuit that drives the word lines out of the inverter circuits, this invention has made it possible to reduce the layout area, resulting in a higher level of circuit integration of the nonvolatile semiconductor memory device.

Furthermore, applying the block selection address line to each source of the subword decoder circuit made up of the inverter circuits gives some freedom in the way that voltages are applied to the word lines during each operation. This in turn permits a series of operations to be performed, especially one for lowering the threshold voltage of the memory cell.

DETAILED DESCRIPTION OF THE INVENTION

Figure 1:
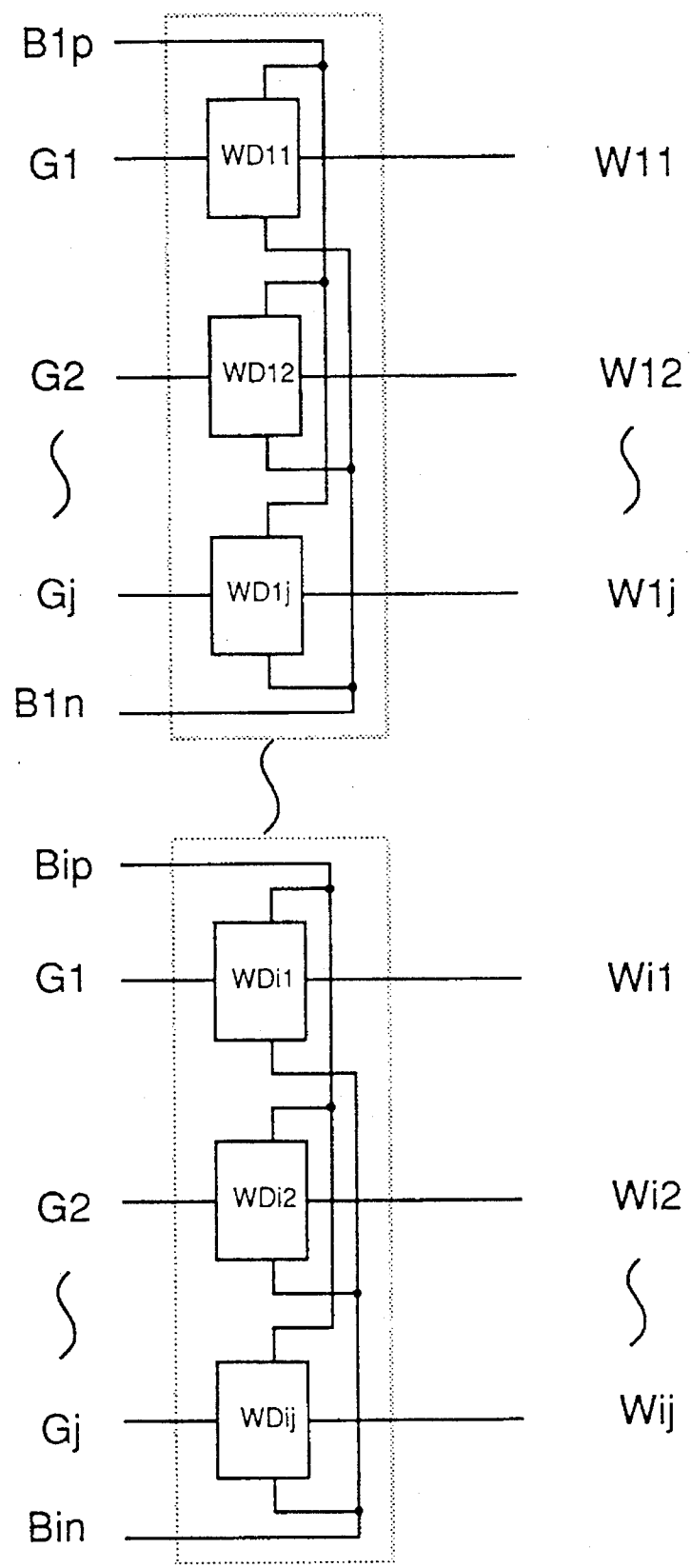
FIG. 1 is a block diagram showing the configuration of a subword decoder circuit of this invention.

FIG. 1 is a circuit block diagram showing the configuration of a subword decoder circuit in a nonvolatile semiconductor memory as one embodiment of this invention.

In the figure, reference numerals W11, W12–W1j, Wi1, Wi2–Wij represent word lines arranged in a hierarchical configuration that control access in two steps. If a word line is expressed generally as Wij, a suffix i represents a block selection address line generated from a first address line group and a suffix j represents a Gate selection address line generated from a second address line group. For example, a word line W12 is activated when the block selection address line generated from the first address line group that selects a word line is "1" and the gate selection address line generated from the second address line group that selects a word line is "2."

Subword decoder circuits WD11–WDij that drive the word lines W11–Wij are constructed of inverter circuits. A voltage applied to the word lines W11–W1j is supplied by the block selection address lines B1p and B1n Generated from the first address line group. A gate selection address line G1 generated from the second address line group is an address line to select a word line in the selected block and is a gate input line to the subword decoder circuits WD11–WDi1.

Information contents stored in nonvolatile semiconductor memory cells are determined by the presence or absence of a cell current that would flow when the supply voltage Vcc is applied to the control gate of a selected memory cell. For example, in flash memory cells, when the floating gate is injected with electrons, the threshold voltage of the memory cell increases, blocking the flow of a cell current. On the other hand, when the electrons are dissipated from the floating gate, the threshold voltage reduces, allowing the cell current to flow.

A technique to raise the threshold voltage of the memory cell involves applying a higher voltage than those of substrate, source and drain to the control gate, i.e., to the potential of the word line to inject electrons into the floating gate by utilizing the Fowler-Nordheim tunnel effect. Electron injection can also be achieved by holding a word line application voltage at a high voltage and a drain application voltage at a high voltage to generate hot electrons due to avalanche, placing electrons on the floating gate.

Lowering the threshold voltage of a memory cell involves applying a negative voltage lower than those of substrate, source and drain to the control gate, i.e., to the potential of the word line to dissipate electrons from the floating gate by utilizing the Fowler-Nordheim tunnel effect.

The process of electron injection and dissipation in flash memory is described, for instance, in Technical Digest of International Electron Device Meeting, pp560–563 1987 and pp.991–993 1992, and in Symposium on VLSI Technology Digest of Technical Papers pp77–78 1991.

The threshold voltage of a memory cell, as described above, can be changed by the injection or dissipation of electrons to and from the floating gate. In the flash memory, there is an operation to verify if the threshold voltage of a memory cell as determined by the electron injection or discharge corresponds to the information stored. That is, it is necessary to ensure that a high threshold voltage prevents the cell current from flowing when the word line is applied a supply voltage Vcc. It is also necessary to ensure that a low threshold voltage permits the cell current to flow.

Considering variations in supply voltage, the verify operation to check a high threshold voltage of a memory cell supplies a potential higher than an upper limit of read supply voltage Vccmax to the word line, rather than the supply voltage Vcc used for reading, and a low threshold voltage verify operation supplies a potential less than a lower limit of read supply voltage Vccmin to the word line.

The nonvolatile semiconductor memory therefore requires a plurality of voltages for application to the control gate, i.e., word line.

In this way, a variety of voltages including positive and negative ones are applied to the word line. In this invention, the subword decoder circuit is constructed of a simple inverter circuit and the block selection address lines Bip, Bin are supplied to the terminal of the inverter circuit to which a fixed voltage such as ordinary supply voltage is applied, in order to allow the variety of voltages to be applied to the word line. The detailed description of the operation will be given later.

Figure 2:
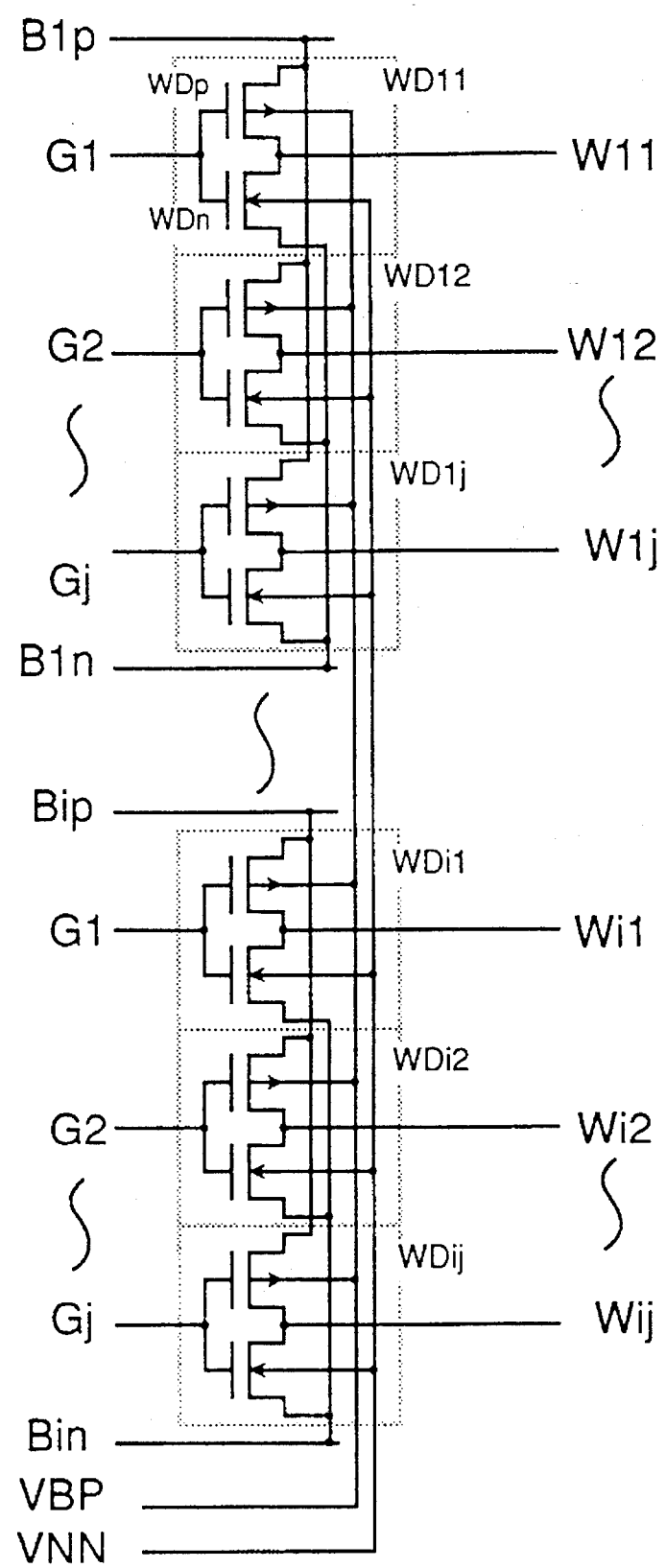
FIG. 2 is a subword decoder circuit diagram of this invention.

FIG. 2 shows details of the subword decoder circuit of the embodiment shown in FIG. 1. As shown in FIG. 2, a single subword decoder circuit consists of a p-channel transistor WDp and an n-channel transistor WDn.

Circuit components of FIG. 2 may be formed on a semiconductor substrate of, say, p-type monocrystalline silicon by a known CMOS (complementary MOS) integrated circuit manufacturing technique. The n-channel transistor consists of a source region, a drain region and a gate electrode, all formed over the surface of the semiconductor substrate. The gate electrode made from such a material as a polysilicon (polycrystalline silicon) is formed over the semiconductor substrate between the source and drain regions with a thin gate insulating film interposed between the substrate surface and the gate electrode. The p-channel transistor is formed in an n-type well region formed over the semiconductor substrate surface. Further, the n-channel transistor handling a negative voltage is formed in a p-type well region diffused in a deep n-type well region (hereinafter referred to as niso). This structure allows the ground potential Vss to be supplied to the common substrate of the ordinary n-channel transistors. The common substrate of p-channel transistors, i.e., the n-type well region is connected with the supply voltage Vcc or a higher voltage. The common substrate for the n-channel transistors formed in the niso, i.e., the diffused p-type well region is connected to the ground potential Vss or a negative voltage. The niso potential is connected to the supply voltage Vcc or the ground potential Vss.

The n-channel transistors of FIG. 2 are n-channel transistors formed in the niso. The p-channel transistors formed in all the subword decoder circuits WD11–WDij have a common substrate and the n-channel transistors formed in the niso also have another common substrate, with the substrate voltage for the p-channel transistors connected to a voltage VBP and the substrate voltage for the n-channel transistors connected to a voltage VNN. The use of a common substrate eliminates the need for isolating the well region, reducing the layout area. The voltage VBP needs to be set to a value higher than the voltage applied to word lines and the voltage VNN should be set to a value lower than the word line application voltage. These voltages are switched to appropriate values in each operation mode. For instance, during the read operation, the voltage VBP is set at the external supply voltage Vcc and the voltage VNN at the ground potential Vss. During the operation that lowers the threshold voltage of a memory cell (including the verify operation), the voltage VBP is set at the external supply voltage Vcc and the voltage VNN at a negative voltage.

Figure 3:
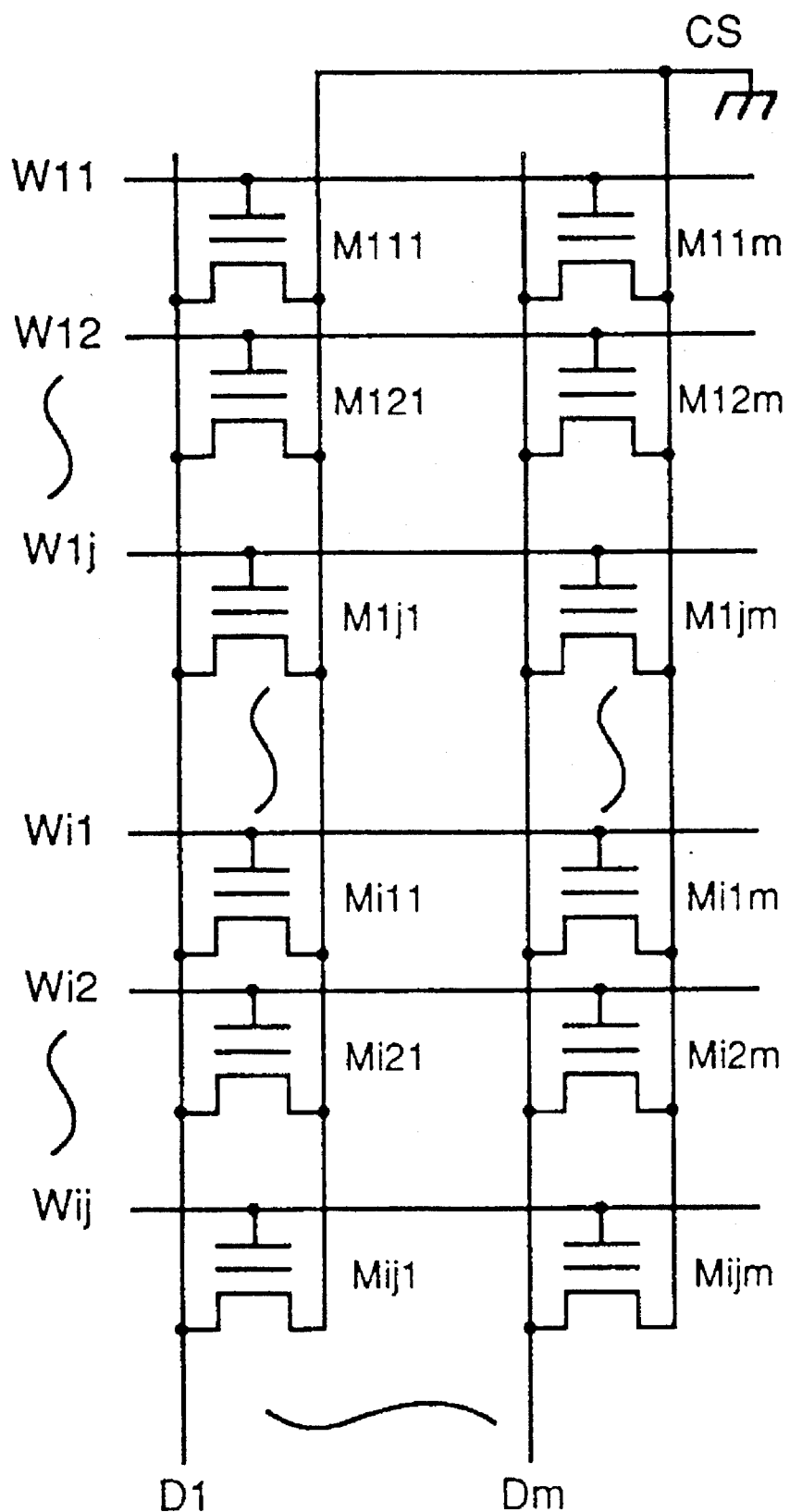
FIG. 3 is a first memory array to which the subword decoder circuit of this invention is applied.
Figure 4:
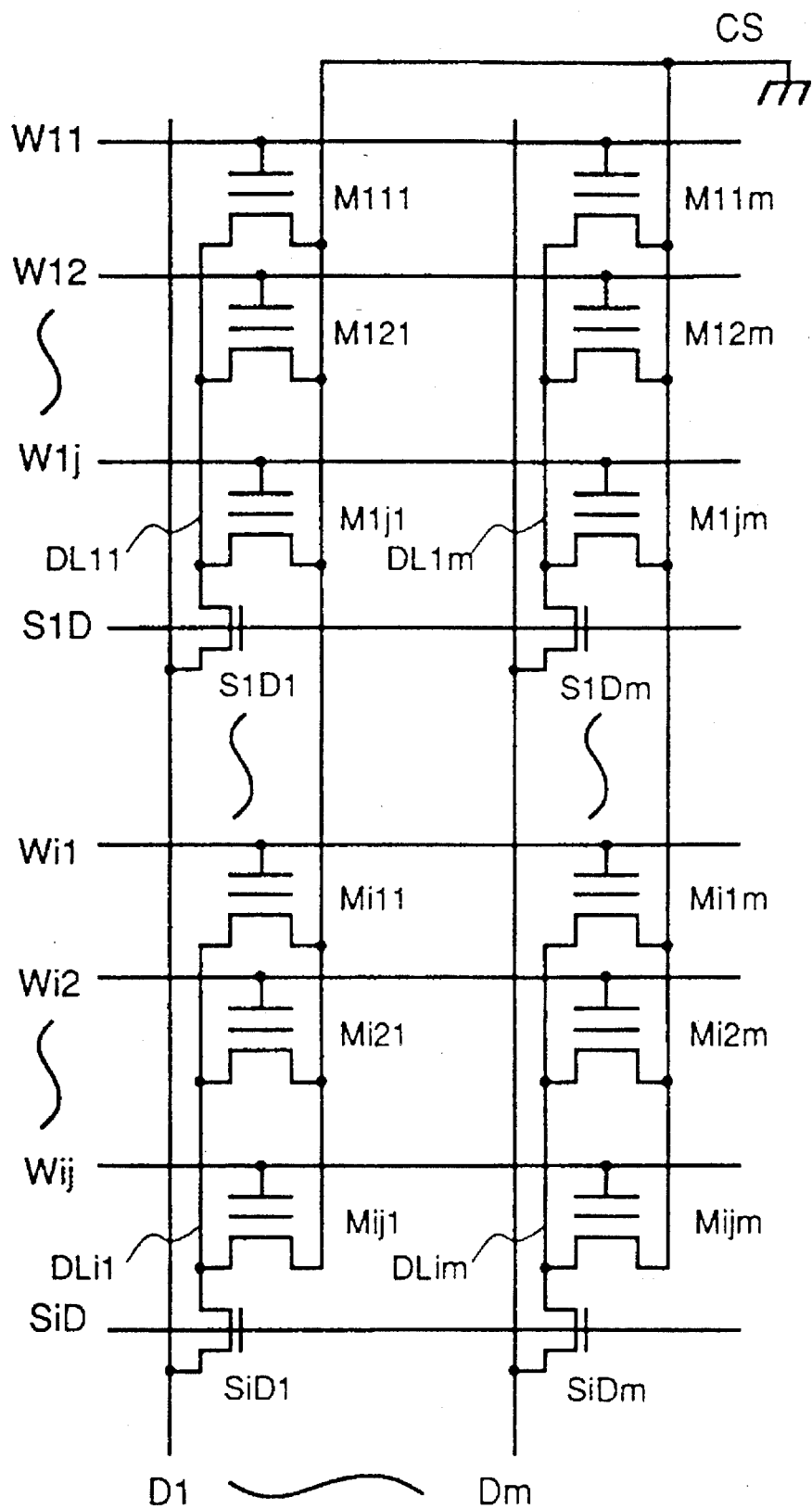
FIG. 4 is a second memory array to which the subword decoder circuit of this invention is applied.
Figure 5:
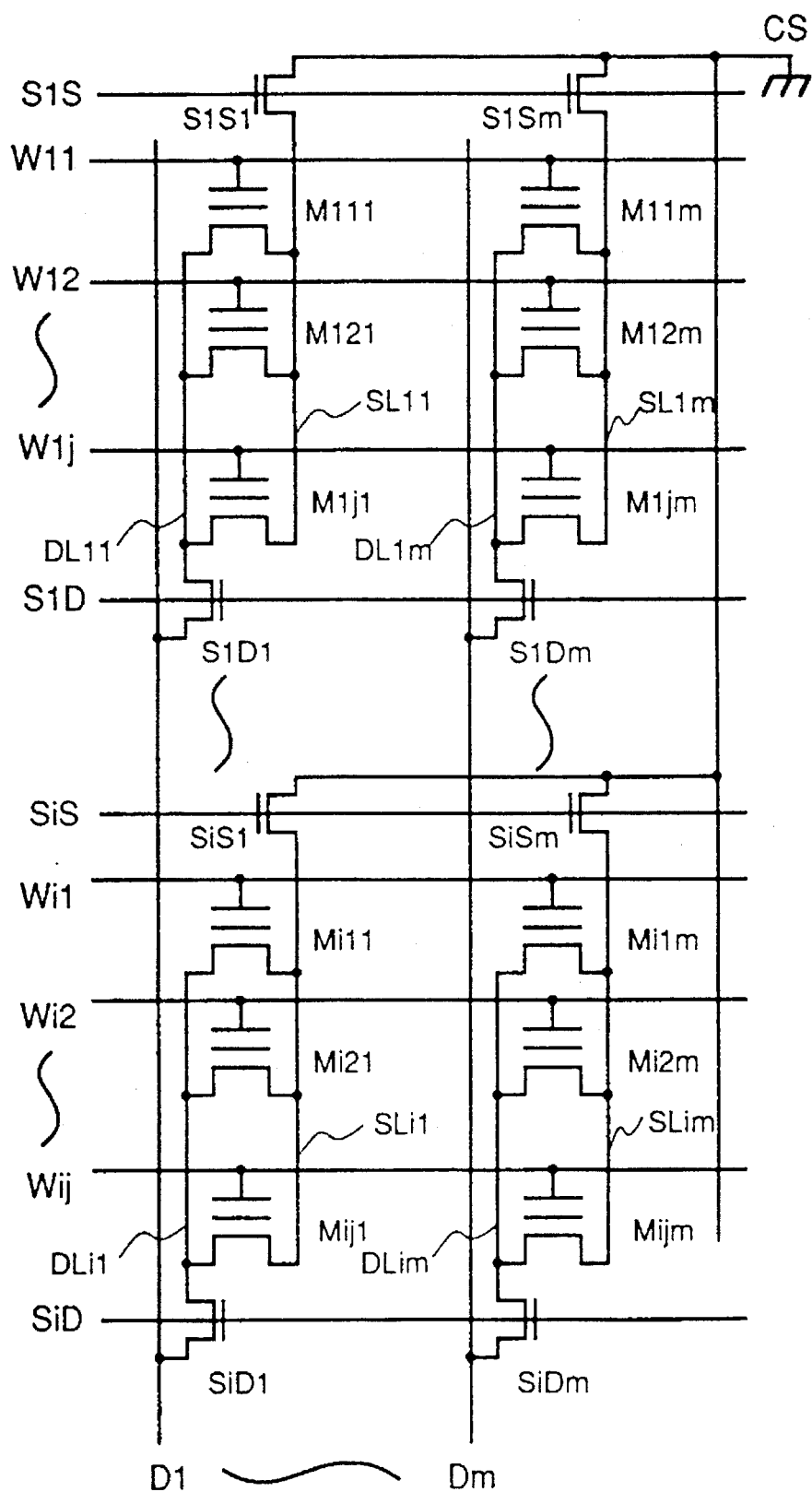
FIG. 5 is a third memory array to which the subword decoder circuit of this invention is applied.

FIG. 3, 4 and 5 show memory array circuits to which the subword decoder circuit of this invention is applied. If a memory cell is represented in general as Mijm, the suffix i stands for a block selection address line generated from a first address line group that selects a word line, the suffix j for a gate selection address line generated from a second address line group that selects a word line, and the suffix m for an address line that selects a data line.

In a memory array circuit shown in FIG. 3, a word line Wij is connected with memory cells Mij1–Mijm, and a data line Dm is connected with memory cells M11m–Mijm. The sources of the memory cells are connected to a common source line CS.

In a memory array circuit shown in FIG. 4, at least two memory cells are treated as one block (for instance M111–M1j1) with their drains connected to a local drain line DL11, DL1m, DLi1, DLim and further to a data line D1–Dm through a drain selection transistor S1D1, S1Dm, SiD1, SiDm which receives a signal line S1D, SiD as a gate input. In other words, connections of the memory cells and the data lines are hierarchically configured compared with the ones shown in FIG. 3.

A memory array circuit shown in FIG. 5 has connections of memory cells and a common source line CS also configured hierarchically. That is, the sources of memory cells making up one block are connected to local source lines SL11, SL1m, SLi1, SLim, which in turn are connected to the common source line CS through source selection transistors S1S1, S1Sm, SIS1, SiSm that receive signal lines S1S, SiS as their gate inputs.

Figure 6:
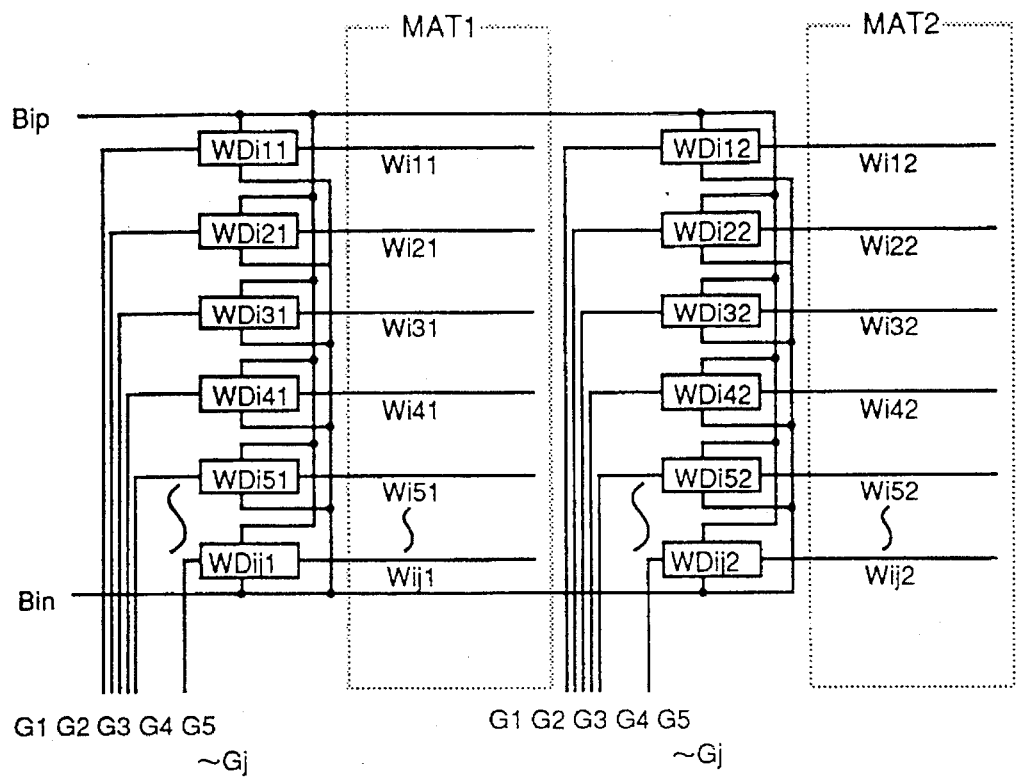
FIG. 6 is a first layout of the subword decoder circuit and a memory array circuit according to this invention.
Figure 7:
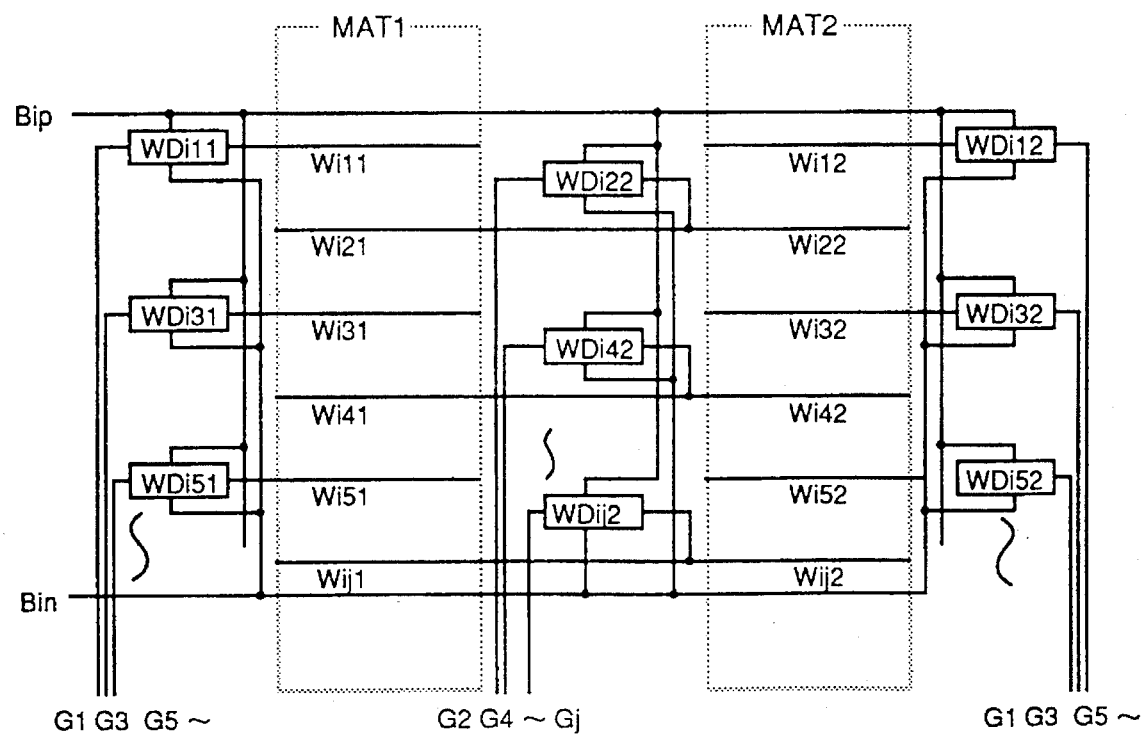
FIG. 7 is a second layout of the subword decoder circuit and the memory array circuit according to this invention.

FIG. 6 and 7 show examples of layout consisting of the subword decoder circuits of this invention and the above-mentioned memory array circuits. This invention is provided with two memory array mats MAT1, MAT2, though any arbitrary number of memory array mats may be employed. In these figures, the word lines and the subword decoder circuits are represented as Wijk and WDijk, respectively, where the suffix i stands for a block selection address line generated from a first address line group that selects a word line, the suffix j for a gate selection address line generated from a second address line group that selects a word line, and the suffix k for a memory mat.

The layout of the subword decoder circuits shown in FIG. 6 represents a case where there is a one-to-one correspondence between the subword decoder circuits WDijk and the word lines Wijk.

In the layout of the subword decoder circuits shown in FIG. 7, when the suffix j of the subword decoder circuit WDijk is even, the subword decoder circuit drives the word lines Wij1 and Wij2 for both memory array mats MAT1 and MAT2. When the suffix j is odd, the subword decoder circuit drives only one word line for one memory mat. This arrangement alleviates the layout pitch of the subword decoder circuits compared to the arrangement of FIG. 6, making it possible to coordinate the layouts of the subword decoder circuits and the word lines even when the word line pitch is small.

Figure 8:
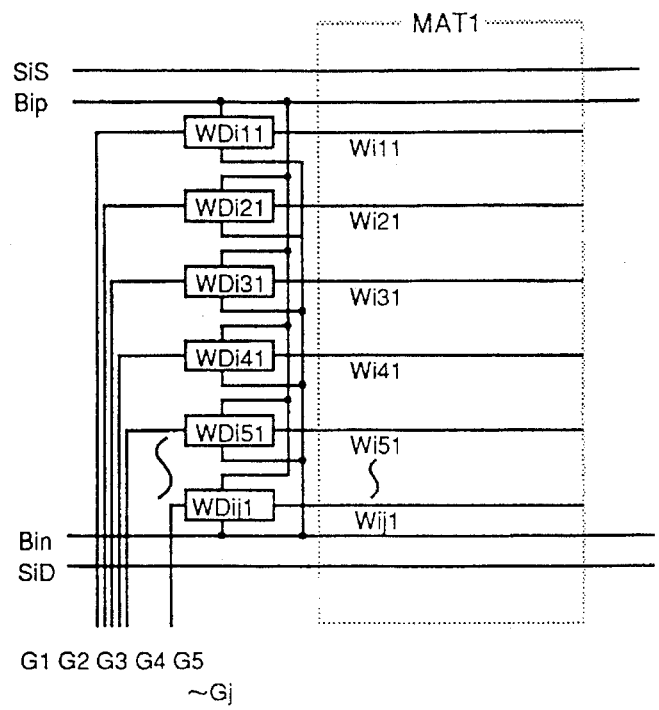
FIG. 8 is a first layout of the subword decoder circuit having a selection transistor in the memory array circuit.
Figure 9:
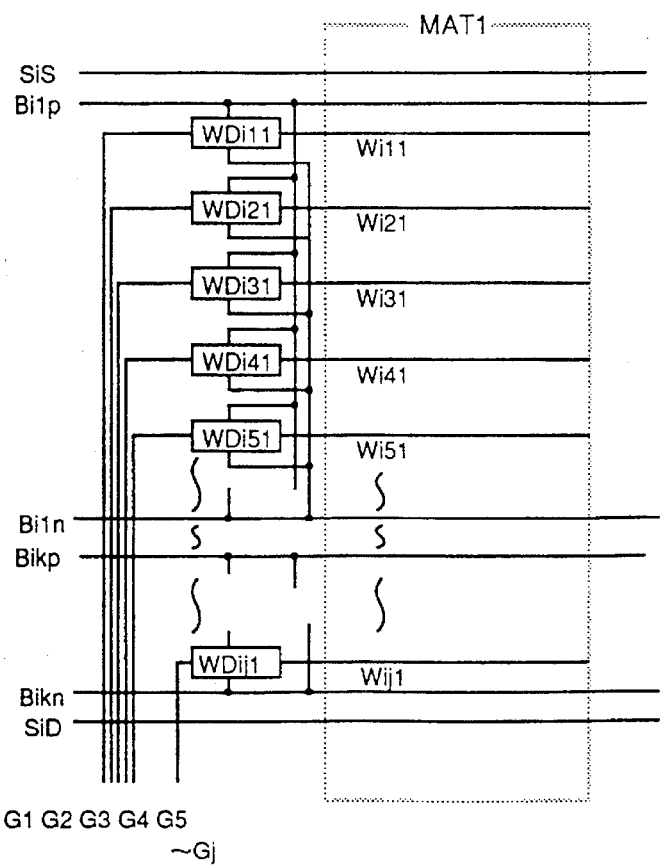
FIG. 9 is a second layout of the subword decoder circuit having a selection transistor in the memory array circuit.

FIG. 8 and 9 show examples of layout of the subword decoder circuits having selection transistors in the memory array circuit, as shown in FIG. 4 or 5. In this embodiment, only one memory array mat is shown.

In the embodiment shown in FIG. 8, the block selection address line generated from a first address line group that selects a word line, i.e., the suffix i corresponds to the suffix i of the selection transistors SiD and SiS.

The embodiment shown in FIG. 9 represents another layout in which one block is divided into sub-blocks and the block selection address line is formed of a plurality of lines. That is, while in the layout of FIG. 8, one block is selected by the block selection address line Bip, Bin, the layout of FIG. 9 selects a block by Bi1p, Bi1n or Bikp, Bikn. This arrangement reduces the parasitic capacitance of the block selection address lines Bi1p, Bi1n or Bikp, Bikn to 1/k.

Figure 10:
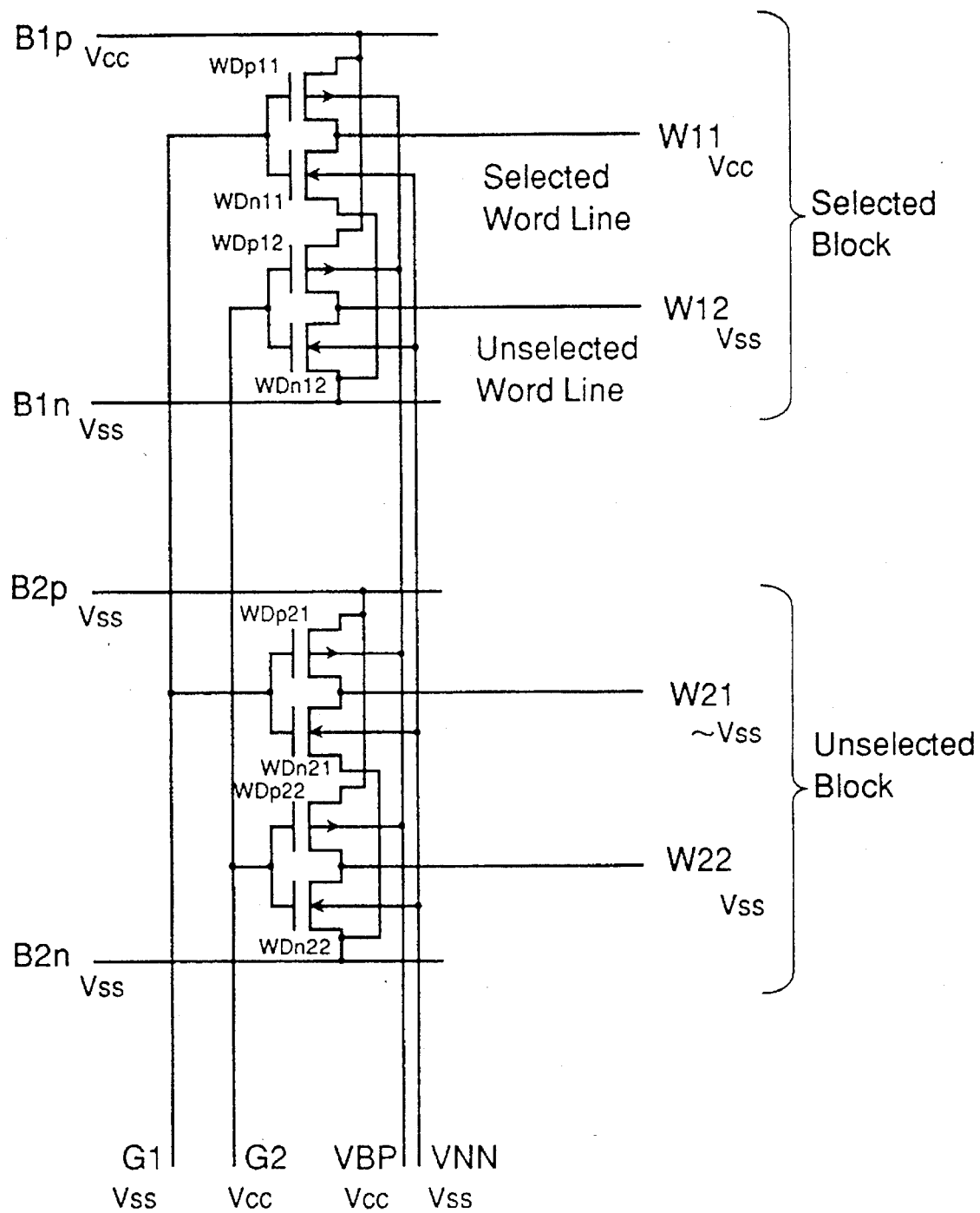
FIG. 10 is a schematic circuit diagram showing a read operation of the subword decoder circuit.

FIG. 10 shows the potential relation between word lines and signal lines during the read operation of the subword decoder circuit.

In the figure, a selected block is on the B1p and B1n side and an in-block selection line G1 is selected. At this time, the potential of a block line B1p is at the external supply voltage Vcc, a block line B1n at the ground potential Vss, block lines B2p and B2n at the ground potential Vss, a gate line G1 at the ground potential Vss and a gate line G2 at the external supply voltage Vcc.

A selected word line W11 is applied the B1p potential Vcc through a p-channel transistor WDp11. An unselected word line W12 in the selected block is applied the B1n potential Vss through an n-channel transistor WDn12. In an unselected block, the potential of a word line W21 connected to the subword decoder circuit which receives the selection gate line G1 is discharged to near the B2p potential Vss through a p-channel transistor WDp21. This potential is a threshold value of the p-channel transistor, about 0.5 V, and thus can be deemed as a low-level potential. The potential of an unselected word line W22 is discharged to the B2n potential Vss through an n-channel transistor WDn22. Selective application of these potentials to the subword decoder circuit causes a voltage Vcc required for read operation to be applied to one word line (in this case, W11).

Although the potential of the word line W21, as mentioned above, cannot be set completely to the ground potential Vss through the p-channel transistor WDp21, no problem arises if the word line is set to the ground potential Vss through the n-channel transistor WDn21 before being selected. This may be achieved by setting the selection gate line G1 to the supply voltage Vcc to set the word line to the ground potential Vss and then by setting the selection gate line G1 to the ground potential Vss to selectively apply the supply voltage Vcc to the word line W11.

Next, to raise the threshold voltage of a memory cell, i.e., to apply a high voltage such as 12 V to a word line, requires setting the potential of the block line B1p and the in-block selection line G2 to 12 V. This allows a high voltage of 12 V to be applied selectively to one word line (for instance, W11). In this case, the common substrate voltage VBP for the p-channel transistors making up the subword decoder circuit needs also to be set to a high voltage of 12 V or higher.

Further, the high threshold voltage verify operation, as mentioned earlier, is done by applying a potential higher than the upper limit of read supply voltage Vccmax, e.g., 1.2–1.5 times the supply voltage Vcc, to the word line. This, too, is achieved by setting the potential of the block line B1p and the in-block selection line G2 to 1.2–1.5 Vcc.

Figure 11:
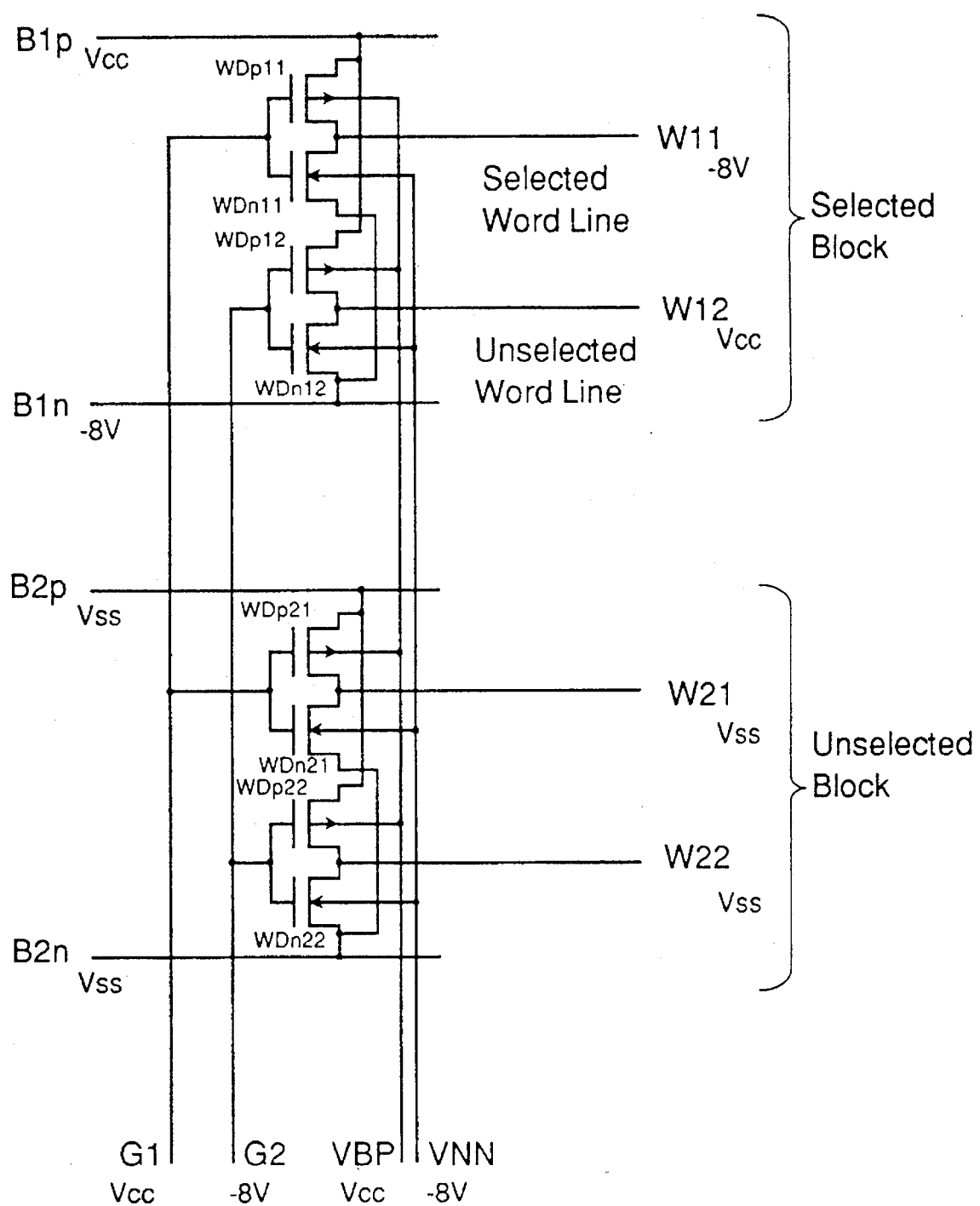
FIG. 11 is a schematic circuit diagram showing the operation of the subword decoder circuit in lowering the threshold value of a memory cell.
Figure 12:
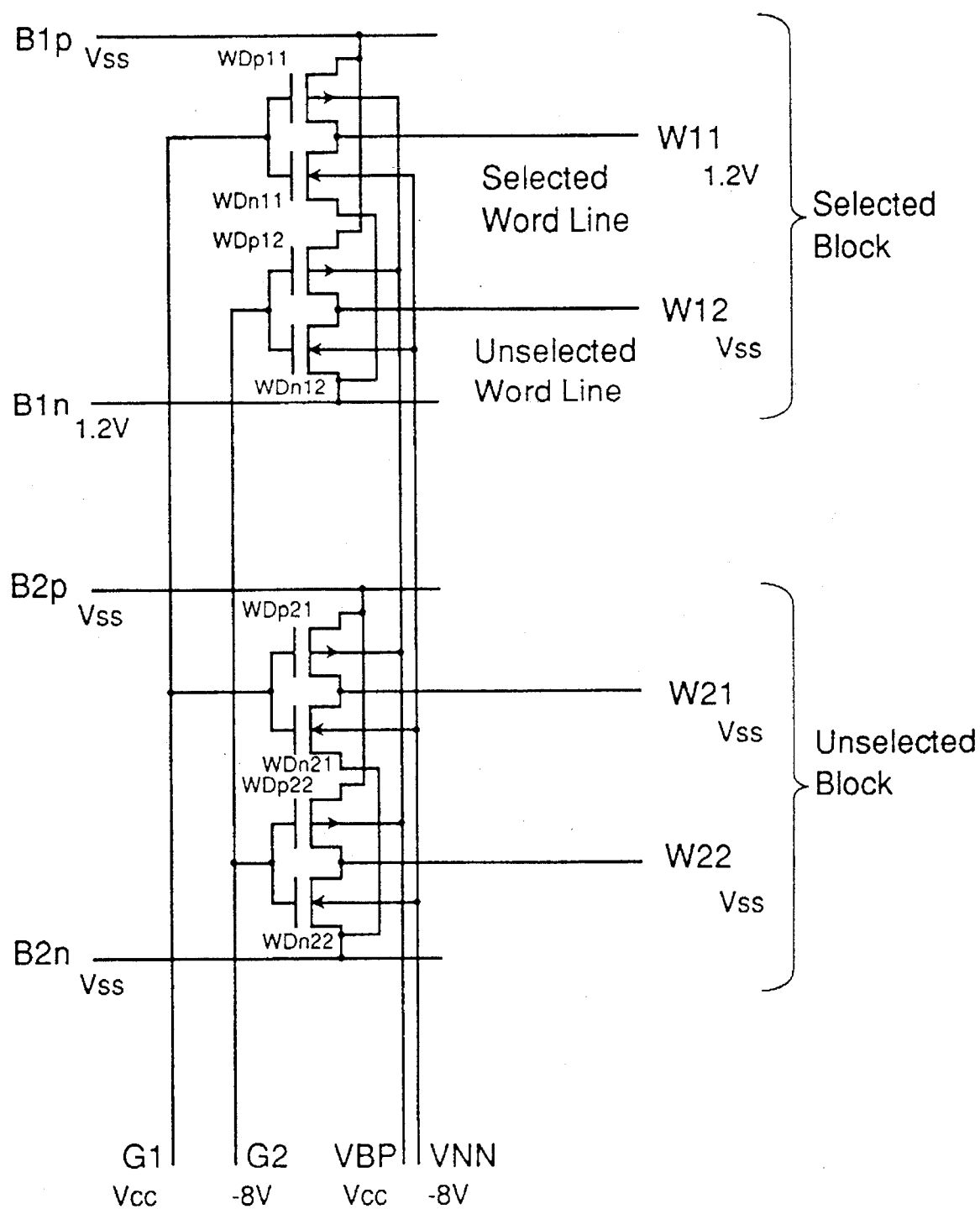
FIG. 12 is a schematic circuit diagram showing the operation of the subword decoder circuit in verifying the lowered threshold value of a memory cell.

FIG. 11 shows the potentials in the word lines and signal lines in the subword decoder circuit during the operation to lower the threshold voltage of a memory cell, and FIG. 12 shows the potentials during the operation to verify the low threshold voltage.

In FIG. 11 and 12, a selected block is the one with B1p and B1n whose suffix i representing the block selection address line generated from a first address line group is 1, and a selected word line is W11.

In the operation to lower the threshold voltage shown in FIG. 11, the potential relation is as follows. A selected word line W11 in the selected block is applied a negative voltage of B1n potential, for example −8 V, through an n-channel transistor WDn11 that makes up the subword decoder circuit. An unselected word line W12 in the selected block is applied the B1p potential through a p-channel transistor WDp12. The potential of the in-block selection line G1 is set to the supply voltage Vcc and the potential of the in-block selection line G2 is set to a negative voltage of −8 V. The potential of B2p, B2n of a nonselected block is set to the ground potential Vss; a nonselected word line W21 connected to a subword decoder circuit that receives a selection gate line G1 is set to the ground potential Vss, the potential of B2n, via an n-channel transistor WDn21; and a nonselected word line W22 is discharged to the B2p potential Vss through a p-channel transistor WDp22. The common substrate voltage VNN for n-channel transistors making up the subword decoder circuit is set to a negative voltage, here −8 V. For this purpose, the n-channel transistor WDn12 is applied a back bias but because the voltage of the gate line G2 is the supply voltage Vcc, the n-channel transistor is reliably turned on, supplying the ground potential Vss to the word line W21.

Here, the potential of the gate line G2 need not necessarily be the supply voltage Vcc and may be higher. For example, it may be the above-mentioned voltage (1.2–1.5 Vcc) used to verify the high threshold voltage. Application of such potentials to the subword decoder circuit permits a negative voltage required for the threshold lowering operation to be selectively applied to one word line (in this case, W11).

The potential relation among the word lines and signal lines during the operation to verify a low threshold voltage, as shown in FIG. 12, is described below.

To allow high-speed switching between the memory cell threshold voltage lowering operation and the verify operation, the gate selection address line Gj is set equal to the voltage during the threshold voltage lowering operation. This eliminates the potential switching of at least gate selection address line and thereby allows high-speed switching of the subword decoder circuits.

The selected word line W11 in the selected block is applied a verify voltage, the potential of B1n, say 1.2 V, through an n-channel transistor WDn11 that forms the subword decoder circuit. An unselected word line W12 in the selected block is applied the B1p potential Vss through a p-channel transistor WDp12. The potential of B2p, B2n of an unselected block is set to the ground potential Vss and an unselected word line W21 is applied the ground potential Vss, the B2n potential, through an n-channel transistor WDn21. The other unselected word line W22 is applied the B2p potential Vss through a p-channel transistor WDp22. By setting the potential of the selected side gate line G1 to the supply voltage Vcc, the back-biased n-channel transistor WDn11 can be turned on to supply the verify voltage of 1.2 V to the word line W11.

The potential of the gate line G2 need not necessarily be the supply voltage Vcc and may be higher. For example, it may be the above-mentioned voltage (1.2–1.5 Vcc) used to verify the high threshold voltage. Application of such potentials to the subword decoder circuit permits a voltage required for the low threshold voltage verify operation to be selectively applied to one word line (in this case, W11).

As described in the foregoing, even when the subword decoder circuits are formed of simple inverters, a variety of word line voltages required by the nonvolatile semiconductor memory cells can be supplied by putting the source and gate terminals of the n- and p-channel transistors in the circuit in an appropriate potential relationship.

Figure 13:
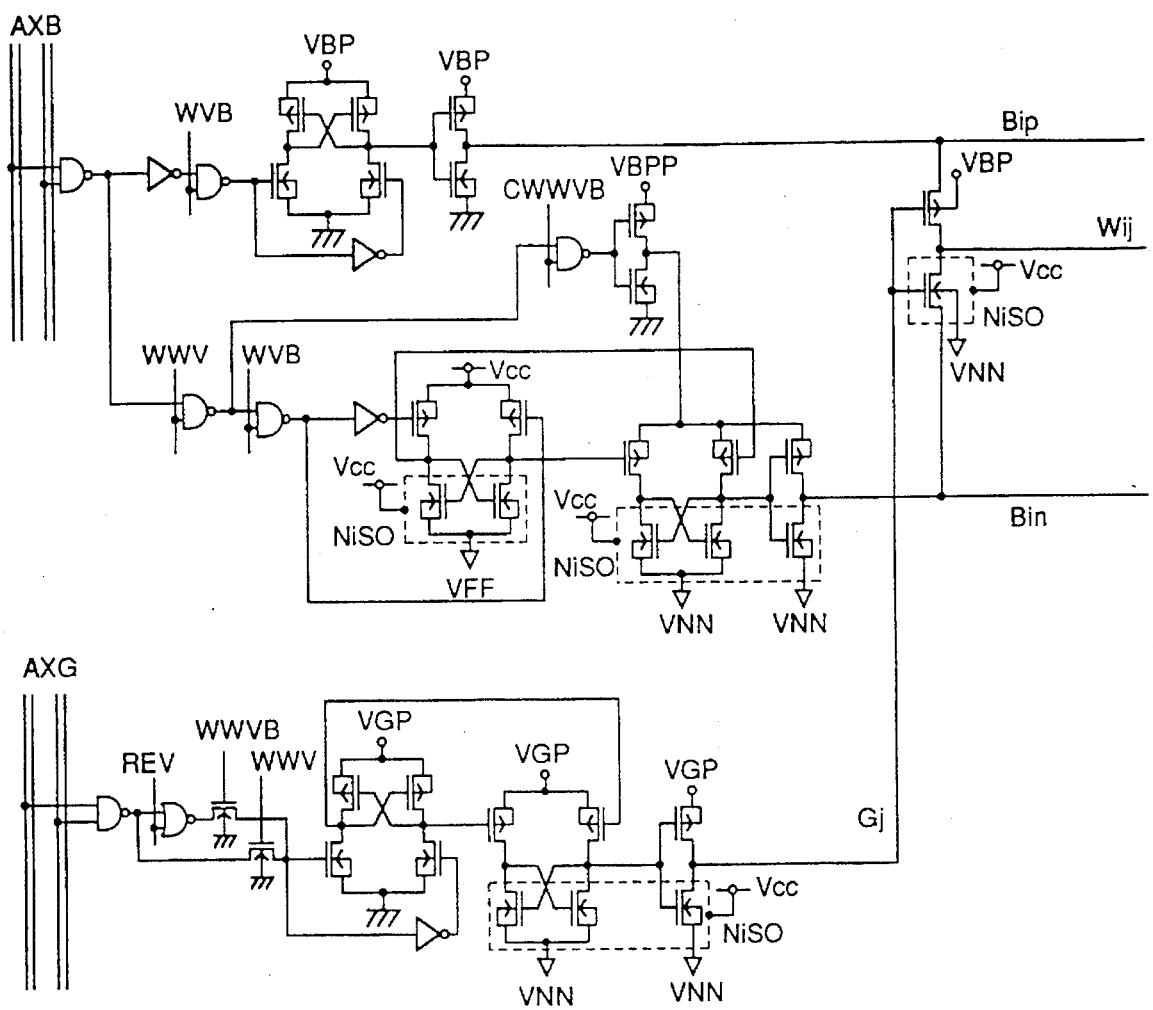
FIG. 13 is a word decoder circuit that controls the subword decoder circuit of this invention.

FIG. 13 shows the detail of an overall word decoder circuit that controls the subword decoder circuit of this invention. In the figure, a voltage conversion circuit used is of a known latch type. The reason that a circuit before the driver circuit that drives the block selection address line Bin has a two-stage configuration is to ensure that there is a minimum required source-drain dielectric strength BVdsmin. The voltage VFF is set to a negative voltage of, say, about –4 V during the operation of lowering the memory cell threshold voltage (including the verify operation) and, in other operations, set to the ground potential Vss. An internal signal line AXB is a complement address line of an output signal line from an address buffer that receives a first address line group as an input. An internal signal line AXG is a complement address line of an output signal line from an address buffer that receives a second address line group as an input. An internal signal line WWV is a signal line that is activated to a high level during the memory cell threshold voltage lowering operation (including a verify operation). An internal signal line WWVB is an inverted signal line of WWVB. An internal signal line WVB is activated to a low level during the low threshold voltage verify operation and during the voltage switching operation. An internal signal line CWWVB is activated to a low level during the threshold lowering operation and during the voltage switching operation. An internal signal line REV is activated to a high level during the read operation to reset the above-mentioned word line to the ground potential Vss through the n-channel transistor before being selected.

Figure 14:
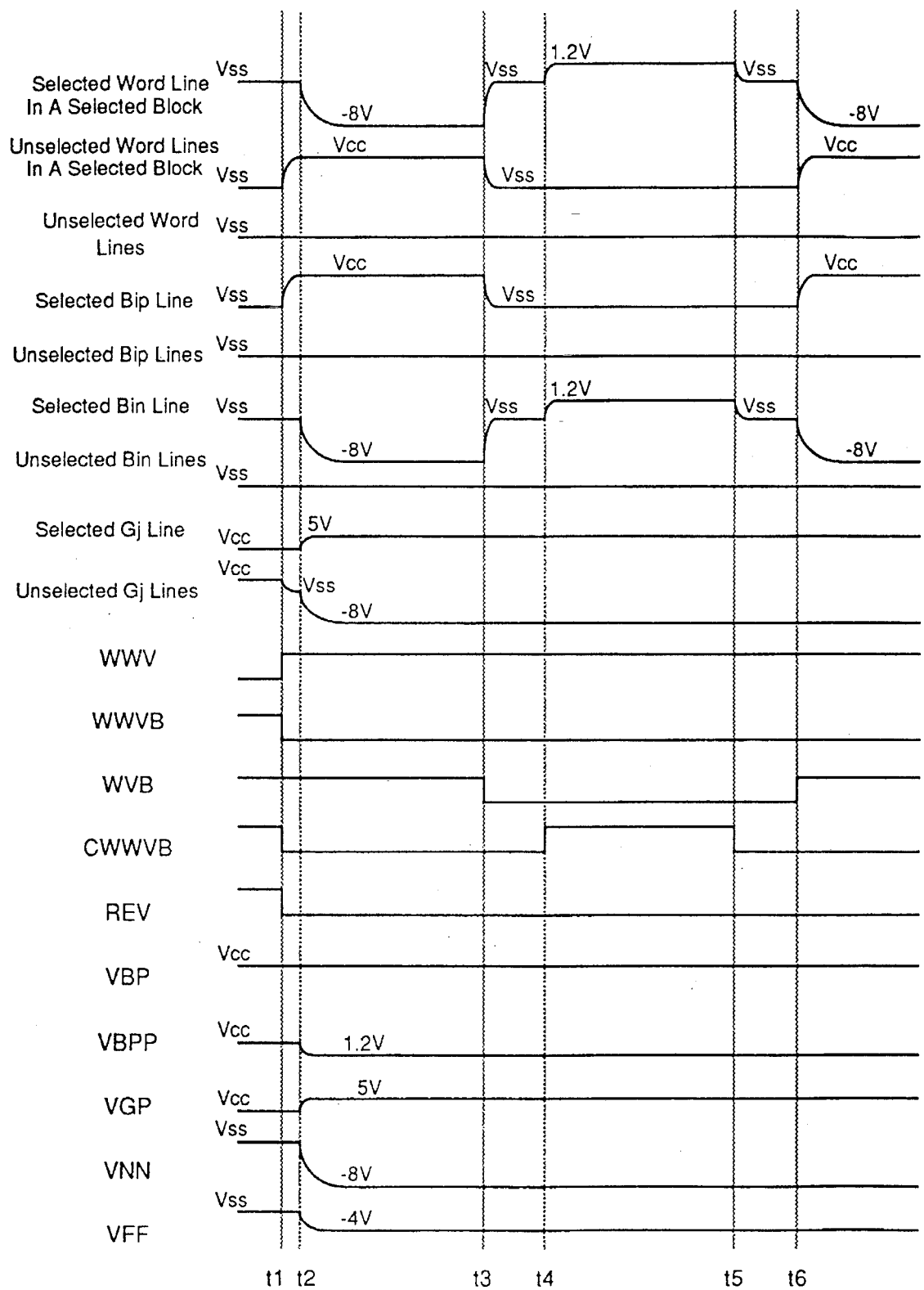
FIG. 14 is a timing waveform diagram during the operation that lowers the threshold value of a memory cell (including a verify operation)

FIG. 14 shows timing waveforms during the operation of lowering the memory cell threshold voltage (including the verify operation). In the figure, up to t1 the circuit is in a standby state and, after t1, enters the operation mode of lowering the threshold voltage. At t1 the internal signal lines WWV, WWVB, CWWVB, REV are activated, causing the unselected lines Gj of the gate selection address line to be held at the ground potential Vss, and the block selection address line Bip and the selected word in the selected block to be set to the supply voltage Vcc. From t2, a start signal line for the built-in supply voltage generation circuit is activated, and the voltage VBPP is set to 1.2 V, the VGP to 5 V, the VNN to a negative voltage of –8 V, and the VFF to a negative voltage of –4 V. The VGP voltage of 5 V is one (1.2–1.5 Vcc) used to verify the aforementioned high threshold voltage.

With the built-in voltage established, the block selection address line Bin and the unselected gate lines Gj are held at a negative voltage of –8 V, and the selected gate line Gj becomes 5 V, allowing the potential of the selected word line in the selected block to be set to a negative voltage of –8 V and the potential of the unselected word line in the selected block to be set to a voltage that can prevent the influence of the drain voltage, i.e., to the supply voltage Vcc. From t2 to t3, the circuit is performing the first operation of lowering the threshold voltage. At t3, the internal signal line WVB is activated, holding the block selection address lines Bip and Bin at the ground potential Vss, resetting all the word lines in the selected block to the ground potential Vss.

From t4 to t5, the internal signal line CWWVB is activated to hold the selected block address line Bin at the verify voltage of 1.2 V, supplying the verify voltage 1.2 V only to the selected word line. At t5, the internal signal CWWVB is deactivated, resetting the selected block address line Bin and the selected word line to the ground potential Vss. During a period from t5 to t6, a decision is made internally or externally based on the result of the verify operation as to whether the operation of lowering the threshold voltage should be continued or, because the desired threshold voltage is reached, should be stopped. In the figure, from t6 forward, the operation of lowering the threshold voltage is repetitively performed. That is, the internal signal line WVB is activated again, bringing the selected word line in the selected block to a negative voltage of –8 V and the unselected word lines in the selected block to the power supply voltage Vcc. After this, the operation following t3 is performed repetitively.

Figure 15:
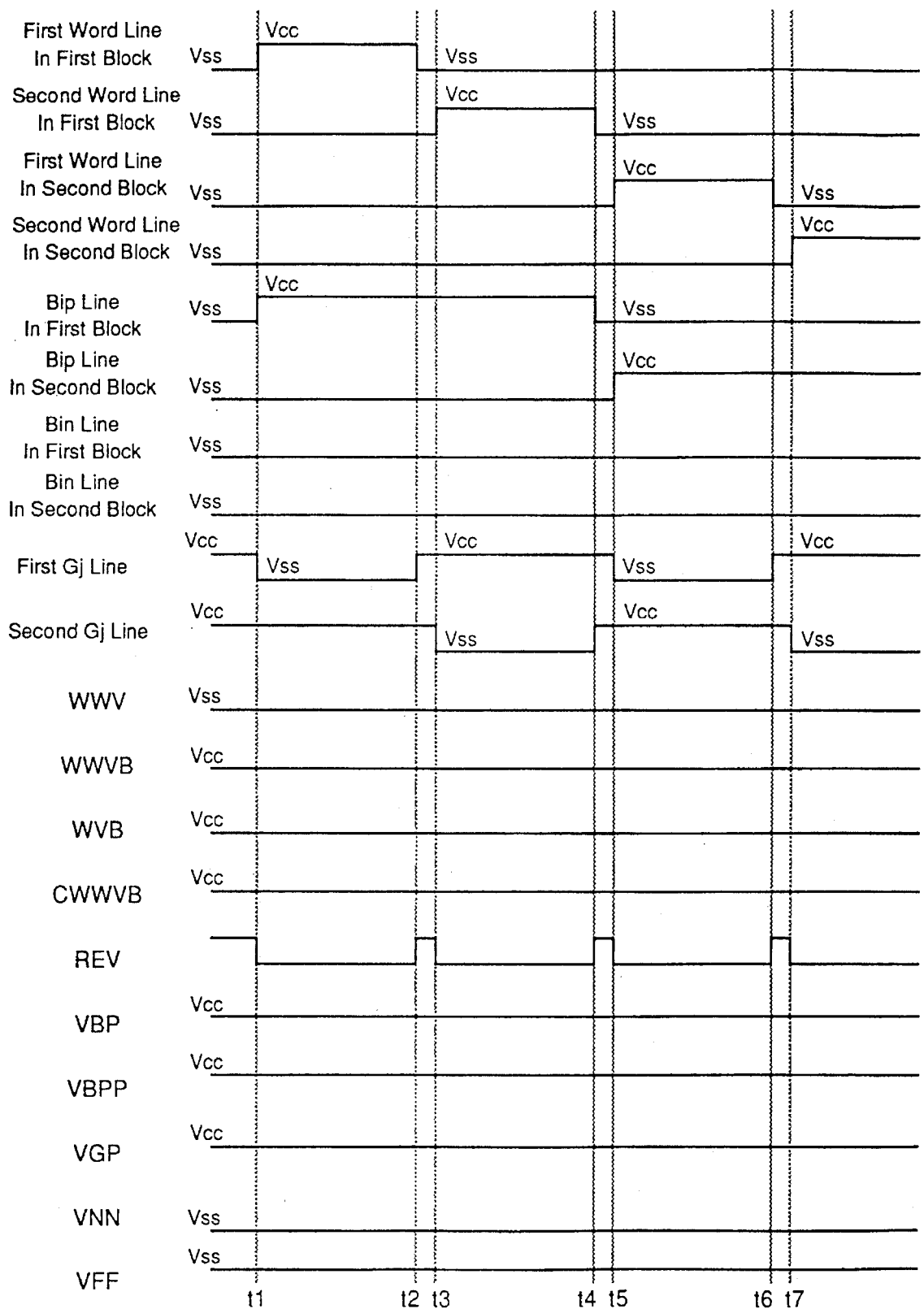
FIG. 15 is a timing waveform diagram during the read operation.

FIG. 15 shows timing waveforms during a read operation. The figure represents a case where different word lines are selected in four consecutive operations. Up to t1 the circuit is in a standby state. The period t1–t2 represents the first selection operation, t3–t4 represents the second operation, t5–t6 represents the third operation, and t7 and later represents the fourth operation of selecting a word line. The first and second selections of word line are performed by the first block Bip line and the third and fourth selections of word line are done by the second block Bip line. The first and third selections of word line use the first gate Gj line and the second and fourth selections use the second gate Gj line.

During the periods up to t1, from t2 to t3, from t4 to t5 and from t6 to t7, the internal signal line REV is activated to a high level to reset each word line, before being selected, to the ground potential Vss through the n-channel transistors of the subword decoder circuits.

Figure 16:
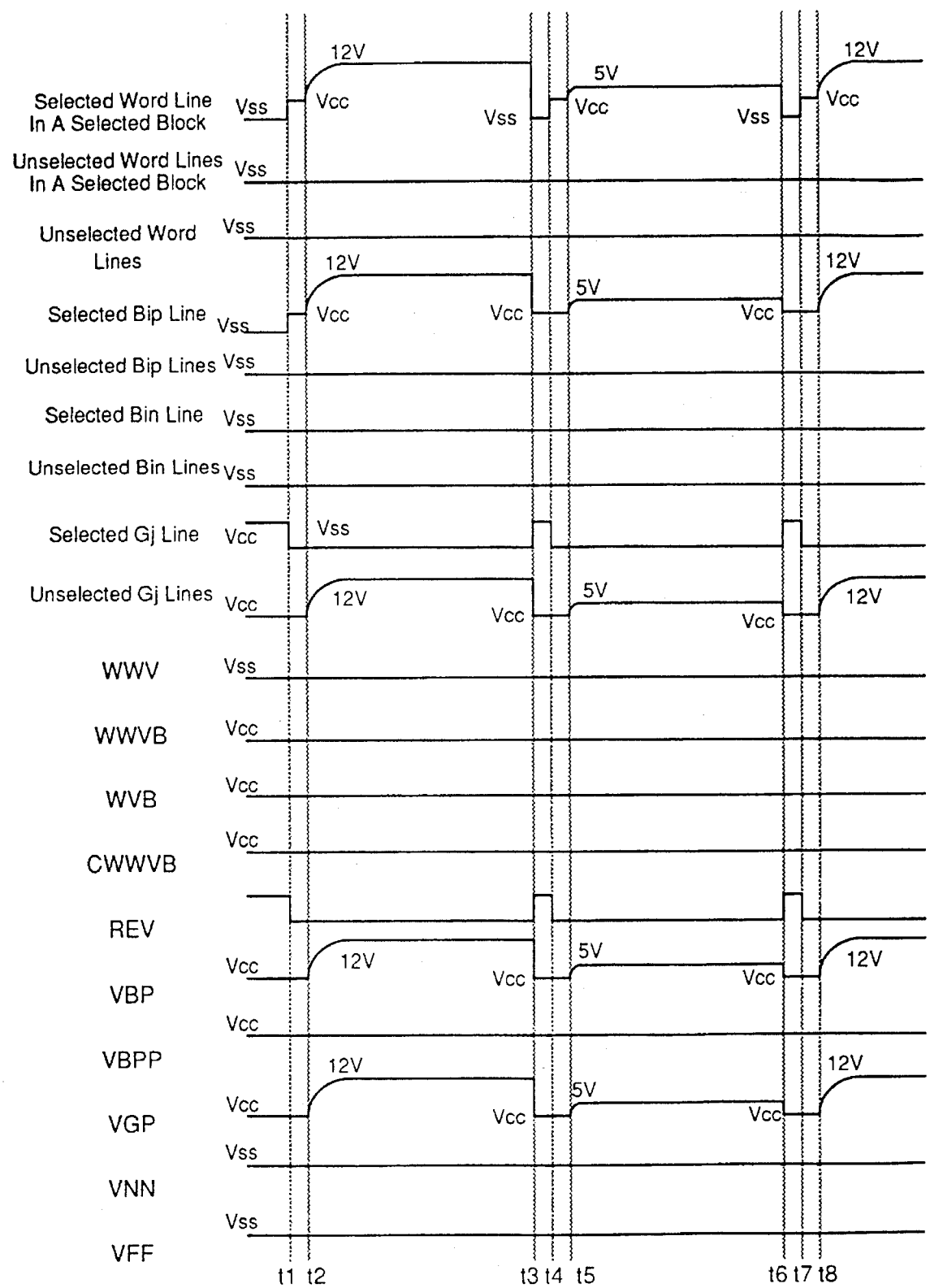
FIG. 16 is a timing waveform diagram during the operation that raises the threshold value of a memory cell (including a verify operation)
Figure 17:
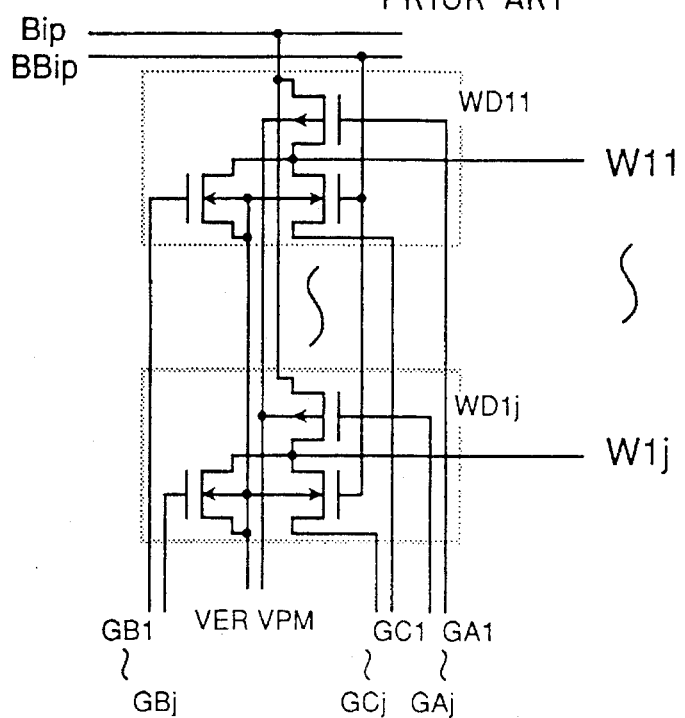
FIG. 17 is a first conventional subword decoder circuit.
Figure 18:
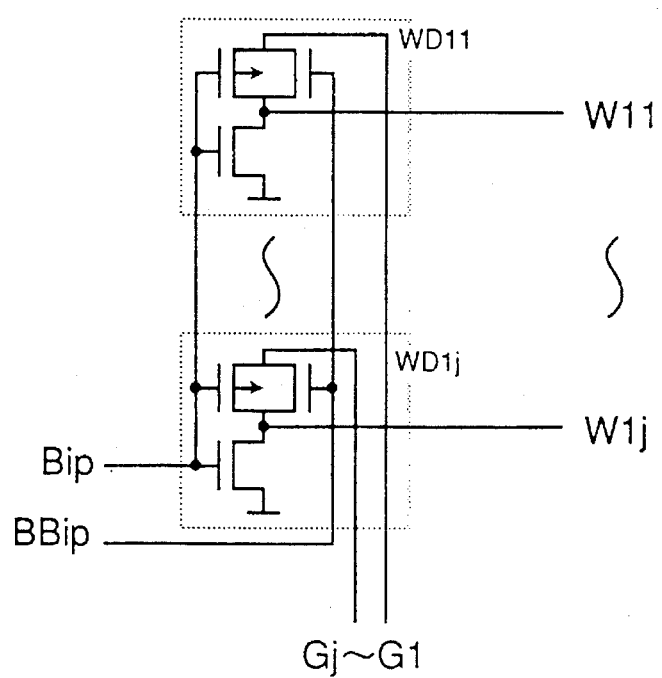
FIG. 18 is a second conventional subword decoder circuit.
Figure 19:
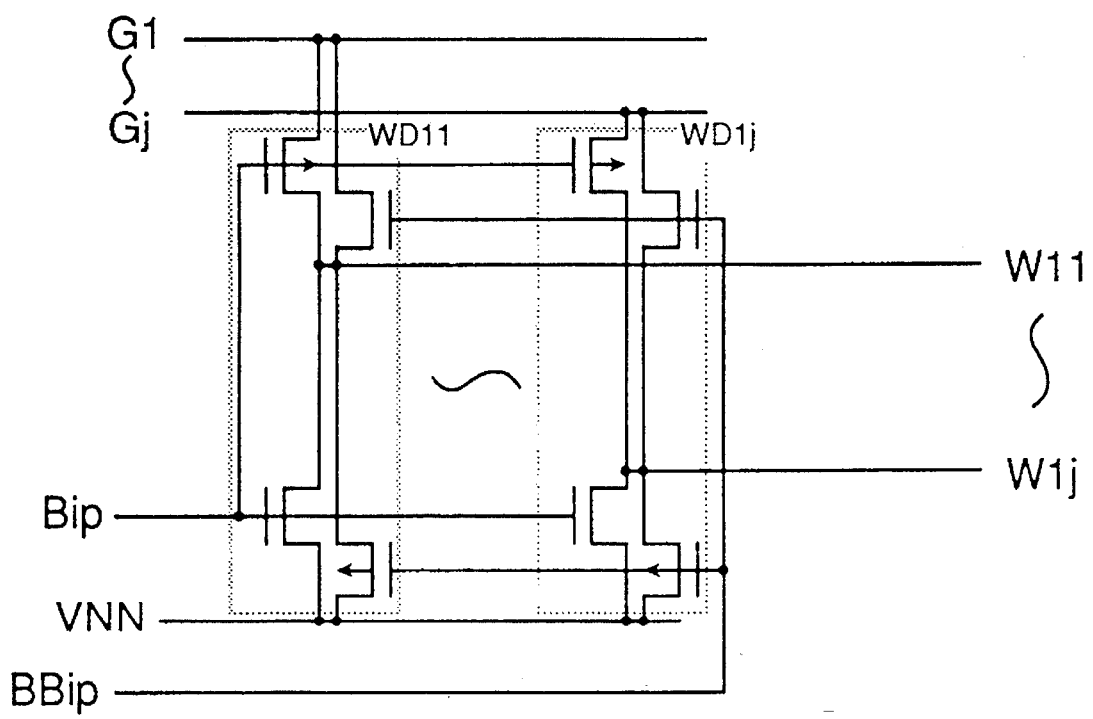
FIG. 19 is a third conventional subword decoder circuit.
Figure 20:
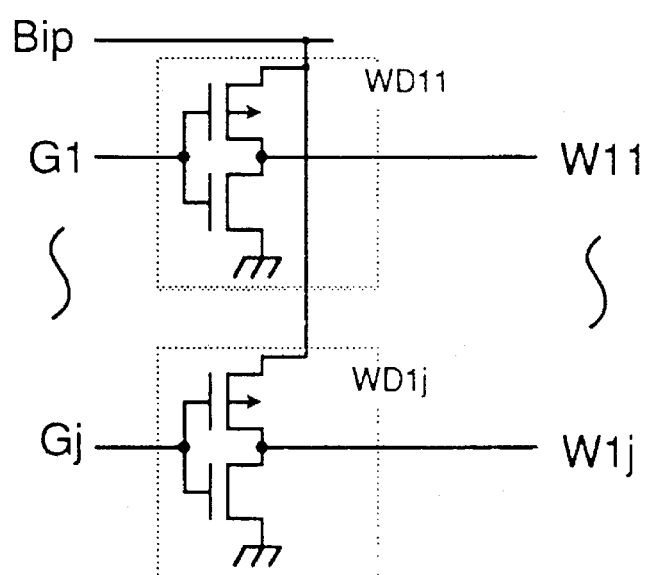
FIG. 20 is a fourth conventional subword decoder circuit.

FIG. 16 shows timing waveforms during the operation of raising the memory cell threshold voltage (including a verify operation). In the figure, up to t1 the circuit is in a standby state. Periods from t2 to t3 and from t8 and later represent the operation to increase the threshold value. During the period from t5 to t6, a verify operation is done. In the periods up to t1, from t3 to t4 and from t6 to t7, the internal signal line REV is activated to a high level, resetting the potential of a word line, before being selected, to the ground potential Vss through the n-channel transistor of the subword decoder circuit. In the periods from t2 to t3, from t5 to t6 and from t8 and later, the start signal line for the built-in supply voltage generating circuit is activated, setting the voltages VBP and VGP to 12 V during the periods from t2 to t3 and from t8 and after and to 5 V during the period from t5 to t6.

From t6 to t7, a decision is made internally or externally based on the result of the verify operation as to whether the operation of raising the threshold voltage should be continued or, because the desired threshold voltage is reached, should be stopped. In the figure, from t7 forward, the operation of increasing the threshold voltage is repetitively performed.

As described above, in the subword decoder circuit that drives a word line, this invention uses two block selection address lines as a supply voltage for the inverter circuit that controls the voltage of the word line. This arrangement reduces the area occupied by the subword decoder circuit, offering such salient advantages as being able to be applied to nonvolatile semiconductor memory devices demanded of high level of circuit integration and being able to reduce the time taken to reprogram nonvolatile semiconductor memory devices that are required to have a unified external power supply.

What is claimed is:

1. A nonvolatile semiconductor memory comprising:
   an electrically erasable and programmable nonvolatile memory cell having a control gate, a drain and a source;
   a word line connected to the control gate of the nonvolatile memory cell;
   a data line connected to the drain of the nonvolatile memory cell; and
   a word line drive circuit to drive the word line;
   wherein the word line drive circuit is an inverter circuit consisting of an n-channel transistor and a p-channel transistor, and the n- and p-channel transistors each have their source line supplied with a block selection address line generated from a first address line group and their gate line supplied with a gate selection address line generated from a second address line group.

2. A nonvolatile semiconductor memory according to claim 1, wherein during a reprogramming operation of lowering a threshold voltage of the nonvolatile memory cell, a negative voltage is applied to the word line through a source-drain path of the n-channel transistor in the word line drive circuit.

3. A nonvolatile semiconductor memory according to claim 2, wherein during the reprogramming operation, the application to the word line of the negative voltage is stopped temporarily, a positive voltage lower than the supply voltage is applied to the word line, and then the negative voltage is applied to the word line again.

* * * * *